United States Patent [19]

Santmann

[11] 4,052,560
[45] Oct. 4, 1977

[54] LOUDSPEAKER DISTORTION REDUCTION SYSTEMS

[76] Inventor: John Bryant Santmann, 66 Cedar Lane, Babylon, N.Y. 11702

[21] Appl. No.: 692,302

[22] Filed: June 3, 1976

[51] Int. Cl.$^2$ ............................................. H04R 3/04
[52] U.S. Cl. .................................................. 179/1 D
[58] Field of Search ...................... 179/1 R, 1 D, 1 P; 328/127, 143, 163; 333/19, 28 T

[56] References Cited

U.S. PATENT DOCUMENTS

| 2,701,328 | 2/1955 | Woodruff | 328/127 |
| 3,073,524 | 1/1963 | Ford | 328/163 |
| 3,755,749 | 8/1973 | Van Ryswyk et al. | 328/127 |
| 3,940,709 | 2/1976 | Heaslett | 179/1 D |

FOREIGN PATENT DOCUMENTS

| 646,354 | 11/1950 | United Kingdom | 328/127 |

*Primary Examiner*—George G. Stellar
*Attorney, Agent, or Firm*—Spencer & Kaye

[57] ABSTRACT

In order to improve the response of a signal transducer of the type which converts an electrical signal into a different form of energy, for example a loudspeaker, and in particular to cause the output produced by the transducer to constitute a more faithful reproduction of the original electrical signal, the input of the signal transducer is connected to a first signal path which provides a signal component proportional to the signal to be reproduced, and to at least one second signal path connected in parallel with, and conducting signals in the same direction as, the first signal conducting path and producing a second signal component which is proportional to a function of at least one of the time derivative and the time integral of the original signal to be reproduced. In preferred embodiments of the invention, the second signal path includes both a time differentiator and a time integrator, connected together in parallel and each adjusted to provide a signal component which acts to substantially compensate for one respective major source of distortion inherent in the transducer.

10 Claims, 6 Drawing Figures

LOUDSPEAKER DISTORTION REDUCTION SYSTEMS

BACKGROUND OF THE INVENTION

The present invention relates to the correction of distortion in electrical signal transducers, and particularly in loudspeakers intended for use in high fidelity sound reproduction systems.

In the field of high fidelity sound reproduction, the primary concern is to provide components which reproduce the original sounds as accurately as possible. To this end, considerable research and development have been conducted in the industry with the aim of improving the performance of each of the component parts of such a system. It is a truism that a sound reproducing system can be no better than the poorest component thereof and the "weakest link" in a sound reproducing system is generally recognized to be the loudspeakers.

One reason for this is that a loudspeaker must convert an electrical signal into physical movement of a structural part and achievement of a high accuracy energy conversion of this type has proven to be a complex problem, particularly since relatively high energy levels are involved. As a result even the best loudspeakers produce noticeable distortion, particularly at the high and low extremes of the audible frequency range.

Numerous approaches for reducing loudspeaker distortion have already been proposed. For example, it is now common practice to effect a certain degree of distortion reduction by employing two or more speakers each designed for optimum performance in a respective frequency range, and to interconnect the speakers by a cross-over network. Based on the principle that the frequency range in which a given speaker has a nominally "flat" response depends on the physical dimensions of the speaker, it is common practice to employ small speakers to reproduce the higher frequency bands, large speakers to reproduce the lower frequency bands, and mid-sized speakers to reproduce the mid-frequency bands. Such systems are, relatively speaking, of limited effectiveness and provide only a modest improvement in overall frequency response.

A second approach involves the use of a number of frequency filters each arranged to pass only a narrow band of frequencies and each associated with means for individually adjusting the relative amplitude of the output of its associated filter. This permits the frequency response of an amplifier connected to all of the filters to be shaped in a manner to compensate for the frequency response of the speakers. Such arrangements require a relatively large number of components and are, as a result, fairly expensive. Moreover, the amplitude of the output of each filter must be adjusted in a specific manner for a given speaker. The adjustments necessary to achieve optimum, or even near optimum, distortion correction for a particular speaker are usually beyond the ability and patience of an ordinary user of audio equipment, who does not possess the necessary technical expertise or the measurement equipment required for good adjustment.

Simple forms of arrangements of this type may employ only a single lowpass filter for influencing the lower portion of the frequency range and a single highpass filter for influencing the upper portion of the frequency range. While such a simple arrangement can be adjusted with relative ease, it cannot produce a substantial correction because a properly designed highpass or lowpass filter will have a substantially uniform response, or attenuation, over the entire range of frequencies which it is to pass, which does not correspond to the nonuniform response of a loudspeaker over the low frequency and high frequency ends of the range of frequencies which must be reproduced in a high quality system.

It has also been proposed to effect distortion correction by connecting an integrator or differentiator in feedback with a signal amplifier. Integrators and differentiators, while they may be constituted by circuits similar to those of highpass and lowpass filters, differ significantly therefrom with regard to the values of their circuit components because the response of an integrator or differentiator to the frequency range over which it is designed to operate is completely different from that of a lowpass filter or highpass filter. For example, while, as noted above, the frequency response of a filter will be substantially uniform over the range of frequencies which it is to pass and will drop off sharply at the edge or edges of that range so that within the range of frequencies to be passed, the output signal from a filter will be an accurate representation of the corresponding frequency components of the applied signal, an integrator or differentiator has a gradually sloping frequency response over the entire range of frequencies on which it is designed to act and will produce an output signal which varies with frequency in a manner differing significantly from the original input signal.

Examples of systems employing an integrator or differentiator in feedback are disclosed in U.S. Pat. Nos. 2,948,778 and 3,014,096, both issued to Warner W. Clements.

When an electrical signal is fed into a transducer, for example an electromagnetic loudspeaker, it produces a force on the movable member of the speaker which is proportional to the current flowing through the transducer. This current is, in turn, proportional to the voltage of the signal, from which it follows that the force applied to the movable part of the transducer is proportional to the voltage of the signal applied to the transducer.

In order for a transducer to perform ideally, with no distortion, it is known that the velocity imparted to the movable portion thereof must be proportional to the voltage of the applied signal, and hence must be proportional to the force acting on that movable portion. Establishment of this relationship with total accuracy requires that the only force opposing the motion of the movable portion be proportional to the velocity of the transducer and such a force is produced by the motional resistance of the air against which the movable portion moves. If this were the only force opposing the motion of the transducer, and if the movable portion of the transducer had sufficient structural integrity, as to approach that of an ideal inelastic solid, ideal performance would result.

However, it is generally known that this is not the case. There are two major additional forces which oppose ideal performance and are significant causes of distortion. First, since the movable part has some mass, it has an associated inertia which always acts to oppose any change in velocity. This inertial force is equal in magnitude and opposite in direction to the acceleration of the movable part. Because of this force it is presently desirable to try to minimize the mass of the moving part, and to a certain extent this is accomplished at the expense of introducing undesirable structural elasticity. Secondly, there is the force exerted on the movable part by its suspension and by air sealed within the speaker enclosure, which combine to create the stiffness of the support for the movable part. These produce a reaction, or restoring, force which acts in a direction to maintain the movable part in its neutral position and this reaction force is equal in magnitude and opposite in direction to the distance of the movable part from its neutral position.

Systems employing an integrator or differentiator are based on a recognition that the acceleration of the movable part is proportional to the time derivative of its velocity, while the excursion of the movable part is proportional to the time integral of its velocity.

While, in theory therefore, an integrator or differentiator connected in feedback with an amplifier should help significantly to compensate for one source or another of loudspeaker distortion, it has been found in practice that prior art arrangements of this type are of limited utility. One reason for this is that it is difficult to properly adjust such devices so as to obtain accurate feedback signals of appropriate amplitude for a given speaker. It has also been found that such a system functions properly only when the relative amplitude of the signal components provided by, or the gain of, the integrator or differentiator is kept small, so that the system will only provide satisfactory correction for small amounts of speaker distortion. In fact, further, if the gain of the integrator or differentiator of such a circuit is increased above a very low level, toward the value required to completely correct for one source of distortion in a speaker of average quality, it tends, because of the feedback connection, to generate instabilities which themselves measurably distort the resulting sound reproduction.

It is believed that one reason for these shortcomings is that such prior art systems are designed in dependence on the assumptions that the restoring force acting on the movable part of a speaker is linearly proportional to the excursion of that part from its neutral position and that the effective mass of the movable part of the speaker is constant, which assumptions are only first order approximations of the conditions found to exist in practice. In systems employing a differentiator or integrator in feedback, and designed according to the abovementioned assumptions, the differences between the approximations which those assumptions represent and the relationships which exist in practice themselves cause signal reproduction errors whose amplitudes bear a positive exponential relation to such differences, unless the gain of the integrator or differentiator is turned down to such a low level that the element no longer has a significant beneficial influence on the resulting sound reproduction.

SUMMARY OF THE INVENTION

It is a primary object of the present invention to eliminate the drawbacks of such prior art arrangements.

Another object of the invention is to substantially improve the sound reproduction quality of any loudspeaker.

A more specific object of the invention is to supply such a loudspeaker with a signal made up of components whose relative amplitudes can be easily adjusted to compensate for major sources of distortion in any existing loudspeaker.

A further specific object of the invention is to achieve such distortion reduction through the use of integrators and differentiators connected in such a manner as to avoid the drawbacks presented by prior art systems utilizing such devices.

These and other objects according to the invention are achieved by a novel electrical circuit unit arranged to be connected between the source of a time varying electrical signal and a transducer, such as a loudspeaker, having an electrical signal input connection, to cause the mechanical output produced by the transducer to constitute an accurate representation of the electrical signal. The circuit according to the invention essentially includes an input terminal for receiving the electrical signal from the source, an output terminal arranged to be connected to the transducer signal input, a signal transmission path connected between the input terminal and the output terminal for supplying to the output terminal a signal component linearly proportional to the electrical signal, and a distortion compensating member having an input connected to the input terminal and an output connected to the output terminal for producing, at its output, a signal component constituting a direct function of at least one of the time derivative and the time integral of the signal appearing at its input. Preferably, a circuit according to the present invention includes both an integrator and a differentiator, the gain of each being individually adjustable in dependence on the particular characteristics of the speaker, or speakers, to be driven by the circuit output signal.

The invention is based on applicant's discovery that the connecting at least one of an integrator and differentiator in parallel with a signal component proportional to the original electrical signal, with the integrator and differentiator being connected to conduct in the forward direction of that signal component, significant compensation for sources of distortion in the responsible loudspeaker can be achieved despite the errors in the assumptions that the restoring force on the movable speaker part is linearly proportional to the excursion thereof and that the effective mass of the movable part is constant. Moreover, in a circuit according to the invention, the integrator or differentiator can be set to have any desired gain without any danger of the generation of instabilities. It is thus possible to individually adjust the gain of an integrator and a differentiator to effect significant compensation for the sources of distortion produced by the inertia of the movable part and the stiffness of its suspension. The integrator and differentiator can be adjusted independently without the adjustment of one having any influence on the contribution of the other and this substantially simplifies the adjustment of a system according to the invention to any particular speaker.

The above-described circuit according to the invention achieves effective distortion reduction, even for a speaker whose actual operating characteristics differ from the assumptions underlying the use of integrators and differentiators. In contrast to a feedback system, the forward connection of the integrator and differentiator according to the invention offers the advantages that the magnitude of the resulting departure from complete distortion reduction will simply be linearly proportional to the difference between the actual and assumed speaker characteristics, while in a feedback system, such difference produces a distortion correction error bearing a quadratic, or exponential relation to the difference. Moreover, a forward-connected system according to the invention is not subject to the instabilities associated with a feedback system.

A further development according to the invention permits compensation to be made for the fact that the restoring force acting on a speaker is not precisely proportional to its excursion and that the effective mass of the movable part of a speaker is not constant. Applicant has observed that the stiffness of the movable part of the speaker is often more nearly proportional to some power greater than 1 of the excursion of the movable part and that the inertial force produced by the movable part is similarly often proportional to some power greater than 1 of the acceleration.

The exponent of the power in each case depends to a certain extent on the particular speaker so that in order to provide a system which can be adjusted to a given speaker, embodiments of the invention employ suitable function generators at the output of the integrator and differentiator, these generators being of a type which can be adjusted to produce an output whose amplitude is a selected power, greater than or equal to 1, of the signal at its input. If each such function generator is adjustable so that its output can be varied between a value corresponding to the first power of the signal at its input and a value corresponding to the fourth power of the signal at its input, the resulting system can be adjusted to provide nearly complete compensation for the distortions produced by the mass and stiffness present any existing loudspeaker sold for high fidelity systems, this including even relatively inexpensive, and thus low quality, speakers.

In embodiments of the invention, use can also be made of function generators which are designed to produce some other type of function.

DESCRIPTION OF THE PREFERRED EMBODIMENTS

Figure 1:
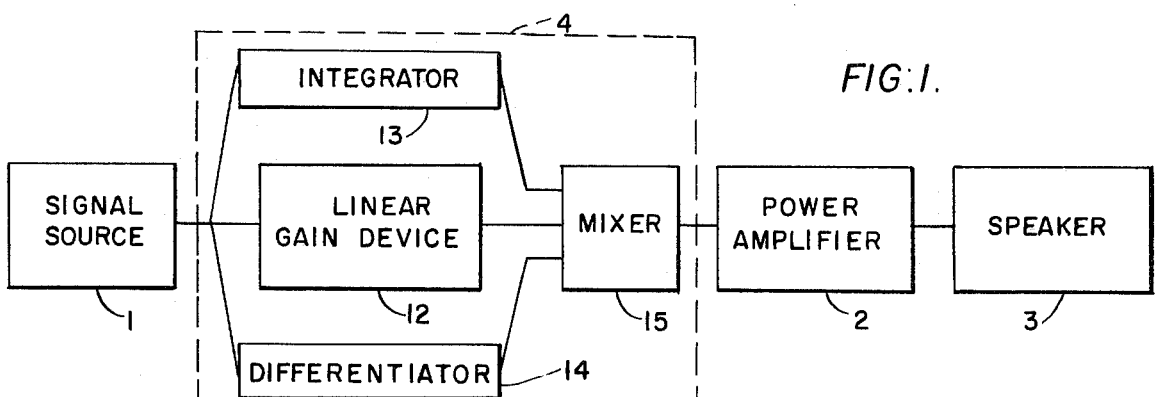
FIG. 1 is a block circuit diagram of a signal amplifying system incorporating a distortion reduction device according to the present invention.

FIG. 1 illlustrates, in generalized block form, a complete audio system in which a signal produced by a source 1 is suitably amplified in a power amplifier 2 and supplied to a speaker 3 which produces an audible representation of the signal provided by source 1.

Signal source 1 can be constituted by any desired type of device, such as a microphone, record or tape player, or broadcast receiver. Power amplifier 2, which is here shown as a single block, can be constituted by any desired type of sound amplifying system, and thus may be constituted by any required number of stages housed in any number of units constituting, for example, a preamplifier and a main amplifier.

In accordance with the present invention, there is connected between the signal source and the power amplifier, a loudspeaker distortion reduction device 4 which, in preferred embodiments, includes a linear gain unit 12, an integrator 13 and a differentiator 14, all three of these components being connected in parallel to conduct signals in the same direction and having their outputs connected to a suitable mixer which algebraically combines the outputs of the unit 12, integrator 13 and differentiator 14 to produce a loudspeaker distortion compensating signal which is supplied to the input of power amplifier 2. If power amplifier 2 is a multi-stage amplifier, the loudspeaker distortion reduction device 4 can, in further accordance with the invention, be connected between any desired pair of stages. The only real limitation in this regard is that device 4 be connected at a point in the amplifying chain where the signal power levels correspond to the capabilities of the component parts of the distortion reduction device, although it is understood that embodiments of such a device can be designed to operate at any desired power level.

A device according to the invention could even be connected between the output of the last power amplifier and the speaker input. In fact, one attractive possibility would be for a circuit according to the invention to be built into a speaker and to the preset to the speaker characteristics at the factory. In this way, the performance of a speaker could be significantly upgraded at a very small additional cost.

The integrator 13 and differentiator 14 are preferably constructed to each have an adjustable gain to enable the proportional contribution of each of these components to the total signal supplied to the speaker to be adjusted to the characteristics of the particular speaker employed in the system. In this way, a given embodiment of the invention can be readily adjusted, by means of only two manual controls, to any one of a wide range of loudspeakers. Adjustment to the particular speaker connected to the power amplifier is quite simple, particularly since adjustment of either one of the components 13 and 14 will not alter the component provided by the other.

Figure 2:
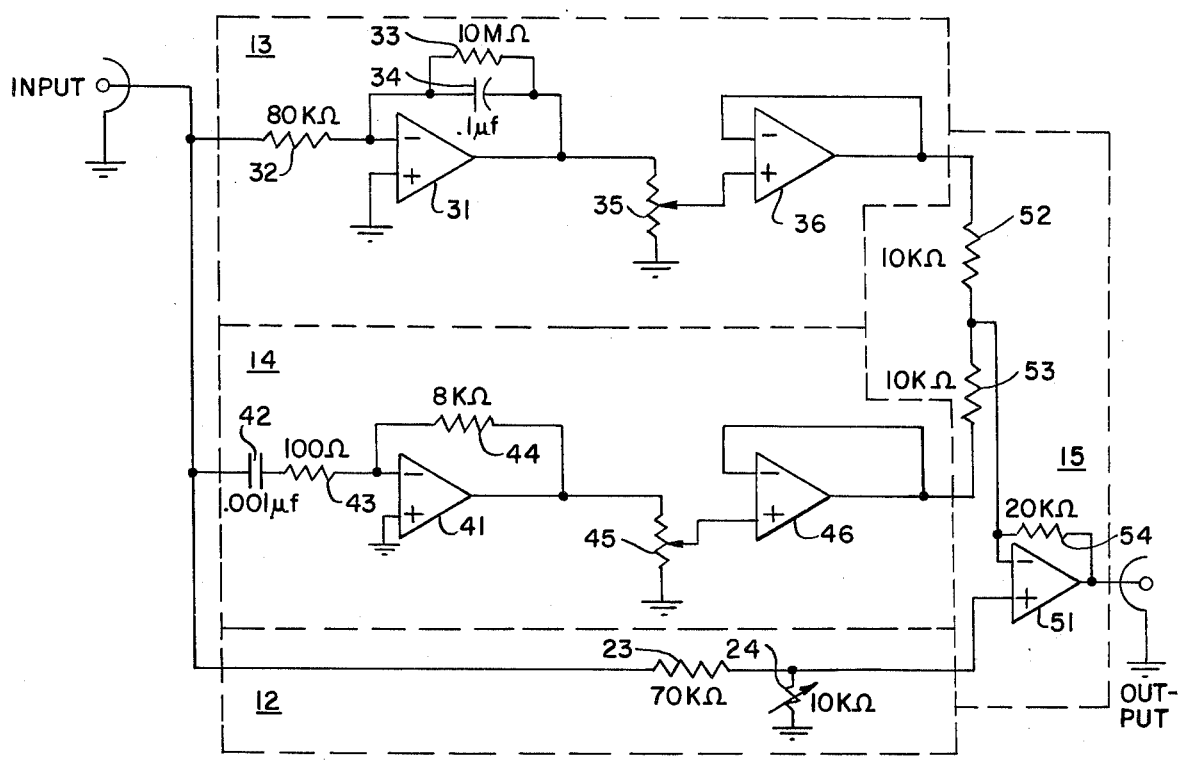
FIG. 2 is a circuit diagram of one preferred embodiment of a basic distortion reduction device according to the invention.

Referring now to FIG. 2, there is shown one specific embodiment of the loudspeaker distortion reduction device according to the invention, this circuit having been actually constructed and tested. The values of the passive components employed in the actual circuit are indicated.

The linear gain unit of this circuit is composed simply of a series resistor 23 and a shunt-connected adjustable resistor 24 which can be adjusted to vary the proportional contribution of the linear gain unit to the total signal supplied to mixer 15.

It will be observed that the integrator 13 and the differentiator 14 are relatively simple circuit devices each constructed according to principles well known in the art. One of the principal advantages of the present invention is that it can be embodied by relatively simple circuits and can thus be fabricated at low cost.

Integrator 13 includes a first high gain differential amplifier 31 having its negative input connected to the loudspeaker distortion reduction device signal input via a series resistor 32. Connected in feedback to the negative input of the amplifier is a parallel arrangement of a further resistor 33 and a capacitor 34. The positive input terminal of amplifier 31 is connected to ground. The output of this amplifier is connected across a first potentiometer 35 whose movable tap is connected to the positive input of a second high gain differential amplifier 36 having a direct feedback connection to its negative input terminal.

The movable tap of potentiometer 35 can be set to vary the proportional contribution, or gain, of integrator 13 to the total signal produced by the distortion reduction device. In view of the connection of the system input to the negative terminal of amplifier 31, the output from the amplifier 36 will be a negative representation of the time integral of the signal applied to the system input.

The differentiator 14 includes a first high gain differential amplifier 41 having its negative input connected to the system signal input via a series arrangement of a capacitor 42 and a resistor 43. The negative input terminal of amplifier 41 is also connected in feedback to its output via a further resistor 44, while the positive input of amplifier 41 is connected to ground. The output of amplifier 41 is connected to a potentiometer 45 whose movable tap is connected to the positive input of a second high gain differential amplifier 46. The negative input terminal of this latter amplifier is provided with a direct feedback connection from the amplifier output. Here again, the output of differentiator 14 is the negative time derivative of the signal supplied to the system input terminal.

In mixer 15, the outputs from integrator 13 and differentiator 14 are supplied to the negative input terminal of a high gain differential amplifier 51 via respective coupling resistors 52 and 53. The negative input terminal of amplifier 51 is also connected in feedback with its output via a resistor 54. Finally, the output of linear gain unit 12 is connected directly to the positive input terminal of amplifier 51, and the output of the distortion reduction device is provided by the output of amplifier 51, which is connected to a suitable external output terminal.

The connection of the outputs of integrator 13 and differentiator 14 to the negative input of amplifier 51 cancels out the polarity reversal occurring in the integrator and differentiator, and thus restores the desired polarity relation between the integrated and differentiated components, on the one hand, and the component, provided by the linear gain unit 12, which is linearly proportional to the original input signal.

While each of devices 13 and 14 will have some effect over the entire frequency range of interest, it will be readily apparent that the contribution of the integrator may well become negligible at higher frequencies, while that of the differentiator may well become negligible at lower frequencies. It can therefore be considered that the integrator may need only be effective in the region of lower frequencies, for example, below 400 Hz and the differentiator may need only be effective in the region of higher frequencies, such as above 1,000 Hz.

Figure 3A:
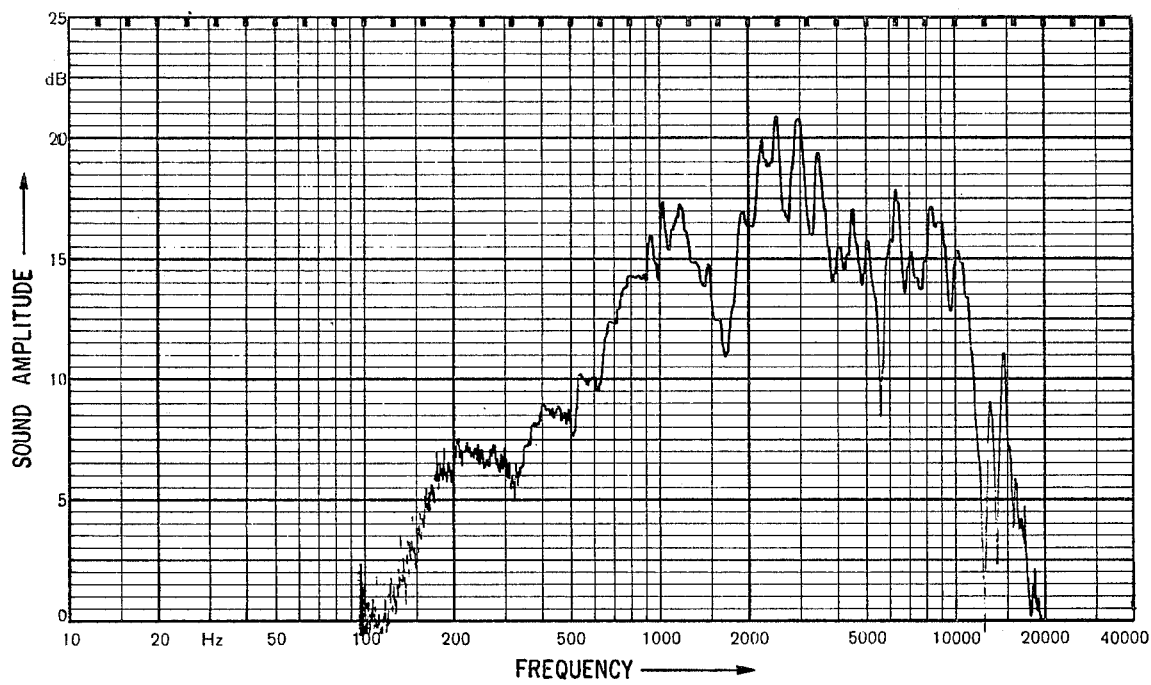
FIGS. 3a and 3b are response vs. frequency diagrams illustrating the improved performance realized by the circuit of FIG. 2.
Figure 3B:
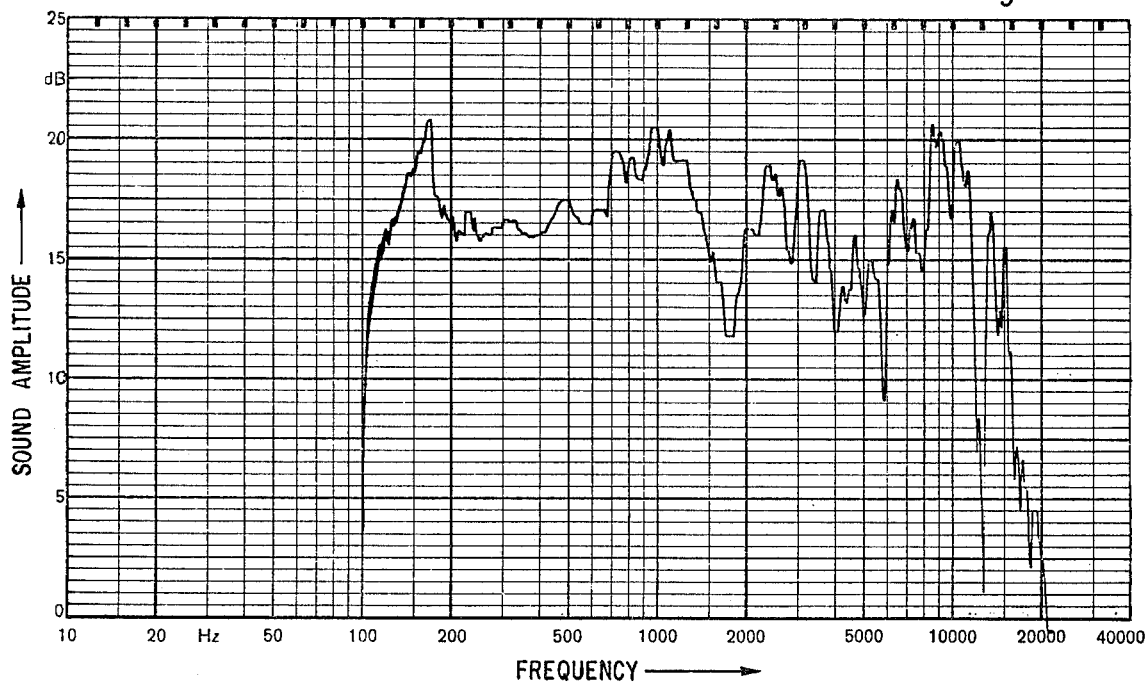

The improvement provided by the particular circuit illustrated in FIG. 2, is depicted in FIGS. 3a and 3b, which illustrate the response vs. frequency characteristics of, respectively, a speaker supplied with signals from a standard amplifier system not equipped with a device according to the invention (FIG. 3a), and the same speaker supplied signals from the same system modified to include the circuit of FIG. 2 (FIG. 3b).

The tests which resulted in these performance curves were performed by personnel of the United States National Bureau of Standards in an anechoic chamber located in the Sound Building (No. 233) of its Gaithersburg, Maryland, facility. All of the test equipment used was provided by the National Bureau of Standards and was calibrated to achieve a final total error of not more than one db. The speaker was also supplied by the National Bureau of Standards and was one manufactured by Goodman Industries Ltd. and sold under the model designation "Axiom 80". For both test runs the speaker sound output was picked up by a microphone placed 2 meters in front of the speaker.

The only difference between the test runs resulting in the curves of FIGS. 3a and 3b was that for the test run resulting in the curve of FIG. 3b a loudspeaker distortion reduction device constructed in accordance with the diagram of FIG. 2 was connected at the preamplifier stage of the power amplifier of the amplifier system. The adjustable components of the loudspeaker distortion reduction device were set so that, at 3,000 Hz, the original signal voltage component contributed by linear gain unit 12 provided 50% of the total output signal voltage from the device, while integrator 13 provided 30% of the total output signal voltage and differentiator 14 provided 20% of the total output signal voltage.

The level of the voltage supplied to the speaker for each test was selected to provide a power level far below the rated maximum for the speaker and to correspond to what would be considered a comfortable listening level.

Comparison of the curves shown on FIGS. 3a and 3b will immediately reveal that the use of the loudspeaker distortion reduction device according to the present invention in a circuit for supplying a signal to a speaker will provide a substantial improvement in the response of the speaker in both the low frequency and the high frequency ranges, without increasing the magnitude of its resonance frequency response. Since the difference between speakers depends to a substantial degree on their relative responses at the low frequency and the high frequency ends of the audible frequency range, the comparative tests indicate that use of a device according to the invention can substantially improve the sound reproduction quality provided by a speaker.

To confirm the results predicted by the curves of FIG. 3, the same musical selections were reproduced by an expensive speaker, a Jensen Model 5, without the distortion reduction device in the circuit, and by an inexpensive speaker, one sold by Radio Shack under catalog No. 40-1316A, with the loudspeaker distortion reduction device connected in the circuit, and were found to have in both cases, substantially the same sound quality to the ear. Although there is, of course, a certain element of subjectivity in such listening tests, they, at the same time, constitute the ultimate critical measure of the quality of any sound reproduction system.

It will further be noted from the curves of FIGS. 3a and 3b that while the device of FIG. 2 compensates for a great deal of the distortion presented in a speaker, it does not by any means provide complete correction and it is believed that further significant corrections can be achieved by modifying the basic distortion reduction device to cause the outputs of the differentiator and integrator units to be other than linearly proportional to the time derivative and time integral, respectively, of the original signal. For many speakers, substantially greater distortion reduction could be achieved by causing the outputs of the differentiator and integrator units to be proportional in magnitude to some power of the time derivative and time integral, respectively, of the original input signal.

More specifically, it would appear that improved results can be achieved if the magnitude of the outputs of these units are proportional to between the first and fourth powers of the differential or integral, respectively. In all cases, the desired algebraic sign, or polarity, at the output of each of the differentiator and integrator units must be the same as the polarity of the derivative of the original signal or integral of the original signal, respectively. For example if, at a given instant, the derivative of the input signal has a negative polarity, the signal components provided by the differentiator unit to the output of the device must have negative polarity, assuming that no polarity reversal occurs in the linear gain unit providing the component proportional to the original signal. In many cases, optimum distortion correction will be achieved by providing a time differential component whose magnitude is proportional to the second power of the time derivative of the original signal. For certain types of speakers, different exponential values will provide optimum results. For example, if the speaker is in a good baffle, best results might be achieved by providing an integral component proportional in magnitude to the time integral of the original signal raised to a power between 1 and 1.5.

For some speakers, achievement of optimum distortion correction might require the establishment of integral and differential components which are related to the time integral and time differential, respectively, of the original input signal according to some different, and possibly more complex, function.

Such improvement appears to be due to the fact that, insofar as concerns the time integral component, the stiffness of a speaker suspension is often more accurately approximated by some non-linear function of the excursion of the movable speaker parts, than by a linear function thereof. Similarly, with regard to the time derivative component, the inertia of the movable part of the speaker can be more accurately approximated by some non-linear function of the acceleration thereof, rather than by a linear function.

Figure 4A:
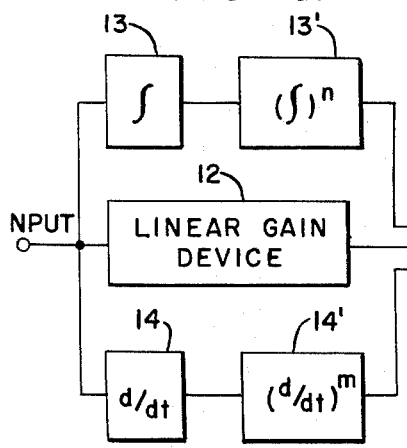
FIGS. 4a and 4b are block circuit diagrams of further preferred embodiments of the invention permitting a further improvement in distortion reduction.
Figure 4B:
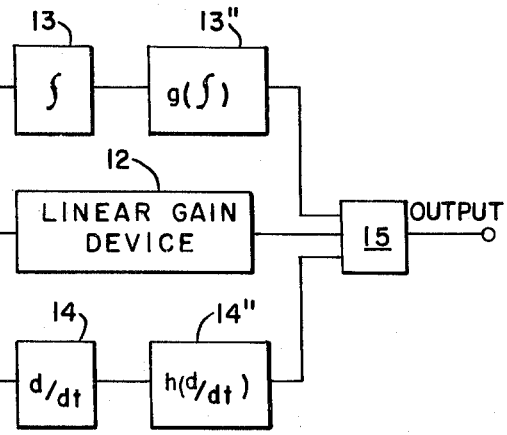

FIGS. 4a and 4b illustrate two embodiments of such an improved device according to the invention.

In FIG. 4a, the time integral branch of the distortion reduction device includes, in addition to the integrator 13, a function generator 13' producing an output voltage whose magnitude is some selected power, $n$, of its input voltage, or in this arrangement some selected power of the output of integrator 13. Function generator 13' could be constituted by any number of well-known circuits having an appropriate non-linear response characteristic. If, for example, it is desired to produce a time integral component whose magnitude is proportional to the square of the time integral of the original input signal, and whose polarity is the same as that of the time integral, generator 13' could be simply constituted by a multiplier with one multiplier input connected to the output of a rectifier whose input is connected to the output of integrator 13 and the other multiplier input connected directly to the output of integrator 13. The rectifier assures preservation of the polarity of the integrator output signal. Similarly, if it is desired to obtain the third power of the time integral of the original signal, generator 13' could be constituted by a cascade arrangement of two multipliers, the first multiplier having both of its inputs connected to the output of integrator 13 and the second multiplier having one input connected to the output of the first multiplier and its second input connected directly to the output of integrator 13. To provide an output whose magnitude is proportional to some other power of the output of integrator 13, various other types of function generator circuits could be employed.

Similarly, to provide a derivative component whose magnitude is proportional to some power, $m$, of the time derivative of the original signal, the differential branch of the device is provided with a suitable function generator 14' connected between the output of differentiator 14 and the respective input of mixer 15. Function generator 14' could be constituted by any of the devices mentioned above with respect to function generator 13'.

FIG. 4b illustrates a more general embodiment of the improved distortion reduction device according to the invention in which the output of integrator 13 is connected to the input of a suitable function generator 13' whose output constitutes any selected function, g, of the voltage applied to its input, the output of function generator 13" being connected to the associated input of mixer 15. Similarly, the output of differentiator 14 is connected to the input of a function generator 14" producing an output voltage which is a selected function, $h$, of the voltage applied to its input. The output of function generator 14' is connected to the respective input of mixer 15. Again, embodiments of generators 13" and 14" would be constructed to assure preservation of the polarity of the signals supplied thereto.

It may thus be seen that the present invention permits a highly flexible and simple approach to the problems of improving loudspeaker sound reproduction. Embodiments of the invention operate in a stable manner and can be readily adjusted to a wide range of speaker characteristics. It would appear that, for a relatively small investment, a device according to the invention could be built to effect any degree of distortion compensation of any loudspeaker.

Moreover, the present invention opens new possibilities for the design of systems having significantly improved sound reproduction quality because it can reduce the demands placed on the speaker designer with regard to minimizing the mass and stiffness of the speaker. Since the design of a speaker always requires a compromise among different, and often conflicting, design criteria, this means that the speaker designer could give greater emphasis to other design parameters at the expense of increased mass and stiffness. Thus, it becomes possible to design a speaker with less concern for these parameters and greater concern for other operation characteristics such as the structural integrity of the movable portion of the speaker, and to combine the speaker with a device according to the invention set to compensate for the larger mass and greater stiffness of the speaker.

It will be understood that the above description of the present invention is susceptible to various modifications, changes and adaptations, and the same are intended to be comprehended within the meaning and range of equivalents of the appended claims.

What is claimed is:

1. An electrical circuit unit arranged to be connected between a source of a time-varying electrical signal composed of frequency components extending across the audio frequency range and a loudspeaker having an electrical signal input to cause the sound output of the loudspeaker to constitute an accurate representation of the electrical signal, comprising: means defining an input terminal for receiving the electrical signal from such source; means defining an output terminal arranged to be connected to the loudspeaker signal input; means defining a signal transmission path connected between said input terminal and said output terminal for supplying to said output terminal a signal component proportional to the electrical signal; and distortion compensating means having an input connected to said input terinal and an output connected to said output terminal for producing, at its output, a signal component constituting a function of at least one of the time derivative and the time integral of the signal appearing at its input, said distortion compensating means comprising integrator means and function generator means connected for supplying to said distortion compensating means output a signal proportional to a predetermined non-linear function of the time integral of the signal appearing at its said input, at least with respect to signal components whose frequencies extend over the lower portion of the audio frequency range.

2. An arrangement as defined in claim 1, wherein said distortion compensting means comprise differentiator means connected for supplying to said distortion compensating means output a signal proportional to the time derivative of the signal appearing at its said input, at least with respect to signal components whose frequencies extend over the upper portion of the audio frequency range.

3. An arrangement as defined in claim 1, wherein said distortion compensating means further comprise adjustable setting means connected for controlling the value of the ratio of the signal at said distortion compensating means output to the signal at said distortion compensating means input at a selected signal frequency.

4. An arrangement as defined in claim 1, wherein the function is the nth power of the said time integral, where $1 < n \leq 4$.

5. An arrangement as defined in claim 4, where $n = 2$.

6. An electrical circuit unit arranged to be connected between a source of a time-varying electrical signal composed of frequency components extending across the audio frequency range and a loudspeaker having an electrical signal input to cause the sound output of the loudspeaker to constitute an accurate representation of the electrical signal, comprising: means defining an input terminal for receiving the electrical signal from such source; means defining an output terminal arranged to be connected to the loudspeaker signal input; means defining a signal transmission path connected between said input terminal and said output terminal for supplying to said output terminal a signal component proportional to the electrical signal; and distortion compensating means having an input connected to said input terminal and an output connected to said output terminal for producing, at its output, a signal component constituting a function of at least one of the time derivative and the time integral of the signal appearing at its input, wherein said distortion compensating means comprise differentiator means and function generator means connected for supplying to said distortion compensating means output a signal proportional to a predetermined non-linear function of the time derivative of the signal at said distortion compensating means input, at least with respect to signal components whose frequencies extend over the upper portion of the audio frequency range.

7. An arrangement as defined in claim 6, wherein the function is the mth power of said time derivative, where $1 < m \leq 4$.

8. An arrangement as defined in claim 7, where $M = 2$.

9. An arrangmnenet as defined in claim 6, wherein said distortion compensating means further comprise integrator means connected for supplying to said distortion compensating means output a signal proportional to the time integral of the signal appearing at its said input, at least with respect to signal components whose frequencies extend over the lower portion of the audio frequency range.

10. An arrangement as defined in claim 9, wherein said distortion compensating means further comprise function generator means connected to said integrator means for causing the signal at said distortion compensating means output to be proportional to a predetermined non-linear function of the time integral of the signal at said distortion compensating means input.

* * * * *